United States Patent [19]

Kawai

[11] 4,108,844

[45] Aug. 22, 1978

[54] PHOTOSENSITIVE POLYESTERS

[75] Inventor: Wasaburo Kawai, Nishinomiya, Japan

[73] Assignee: Agency of Industrial Science & Technology, Tokyo, Japan

[21] Appl. No.: 770,847

[22] Filed: Feb. 22, 1977

[30] Foreign Application Priority Data

Feb. 25, 1976 [JP] Japan .................................. 51/20253

[51] Int. Cl.$^2$ .............................................. C08G 63/00
[52] U.S. Cl. ................................. 526/217; 96/115 R; 204/159.19; 526/273; 528/361; 528/366
[58] Field of Search ........... 260/75 UA, 75 R, 75 EP, 260/47 C, 78.41

[56] References Cited

U.S. PATENT DOCUMENTS

| | | | |
|---|---|---|---|
| 3,674,745 | 7/1972 | Philpot et al. .................. | 260/75 UA |
| 3,878,076 | 4/1975 | Nishikubo et al. .............. | 204/159.15 |
| 3,933,746 | 1/1976 | Steele ................................. | 260/47 C |

*Primary Examiner*—Lucille M. Phynes
*Attorney, Agent, or Firm*—Oblon, Fisher, Spivak, McClelland & Maier

[57] ABSTRACT

Polyesters having as the repeating unit thereof a unit of the generic formula:

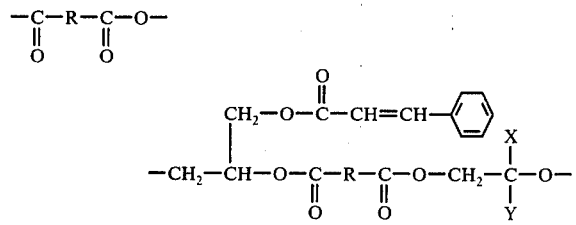

(wherein, X stands for a hydrogen atom, a lower alkyl group, a phenyl group or a cinnamoyl-oxymethyl group, Y for a hydrogen atom or a lower alkyl group and R for —CH=CH—, —CH$_2$—CH$_2$— or O-phenylene group) are new polyesters possessed of photosensitivity. These photosensitive polyesters are produced by the reaction of acid anhydrides with glycidyl cinnamate.

4 Claims, 4 Drawing Figures

PHOTOSENSITIVE POLYESTERS

BACKGROUND OF THE INVENTION

This invention relates to new photosensitive polyesters and to a method for the manufacture thereof.

Nemerous photosensitive polymers have heretofore been developed. However, the insufficient photosensitivity of many of these polymers had to be augmented by using sensitizers or by increasing the light-source intensity at time of use. Use of a sensitizer, however, entails the disadvantage that a difficult problem arises with respect to quality control of the sensitizer itself and that the produced polymer may exude the sensitizer in the course of use and, therefore, the range of the applicability of the product is limited. Increasing the intensity of the light-source output entails an economic disadvantage in that power consumption is increased.

The inventor made a devoted study in search of photosensitive polymers which are free from such disadvantages of the conventional photosensitive polymers and which exhibit advantageous photosensitivity without use of a sensitizer. He has consequently accomplished this invention.

A major object of the present invention is to provide photosensitive polymers excelling the conventional photosensitive polymers in photosensitivity.

Another object of this invention is to provide a method for the manufacture of photosensitive polymers excelling the conventional photosensitive polymers in photosensitivity.

SUMMARY OF THE INVENTION

To attain the objects described above according to the present invention, there are provided polymers which are polyesters possessed of a cinnamoyl-oxymethyl group in the pendant group. The polyesters have as the repeating unit thereof a unit of the generic formula:

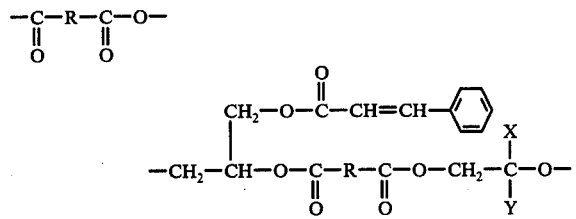

(wherein, X stands for one member selected from the class consisting of a hydrogen atom, alkyl groups having one to four carbon atoms, a phenyl group and a cinnamoyl-oxymethyl group, Y for one member selected from the class consisting of a hydrogen atom and alkyl groups having one to four carbon atoms and R for one member selected from the class consisting of $-CH=CH-$, $-CH_2-CH_2-$ and O-phenylene group). These polyesters each contain at least five repeating units. The polyesters of the present invention are produced immediately by heating glycidyl cinnamate and acid anhydrides of the generic formula:

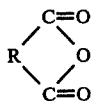

(wherein, R stands for $-CH=CH-$, $-CH_2-CH_2-$ or O-phenylene group) in the presence of a tertiary amine or a salt thereof used as the catalyst.

DETAILED DESCRIPTION OF THE INVENTION

Figure 1:
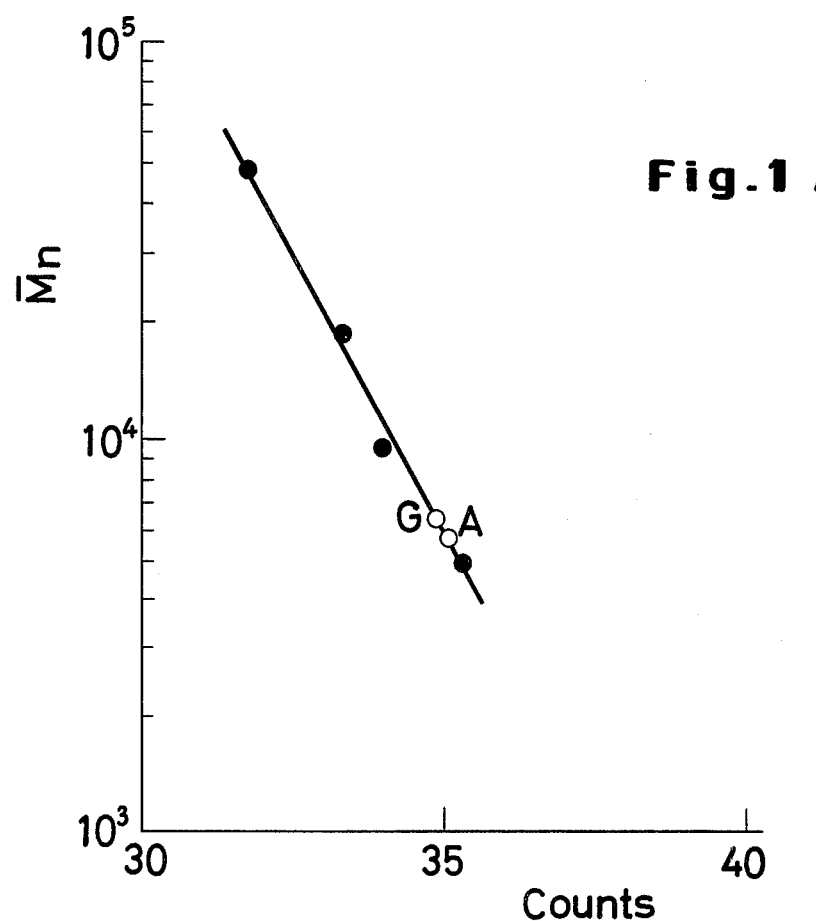
FIG. 1 is a gelpermeation chromatograph for determining molecular weights of polyesters formed in preferred embodiments.
Figure 1:
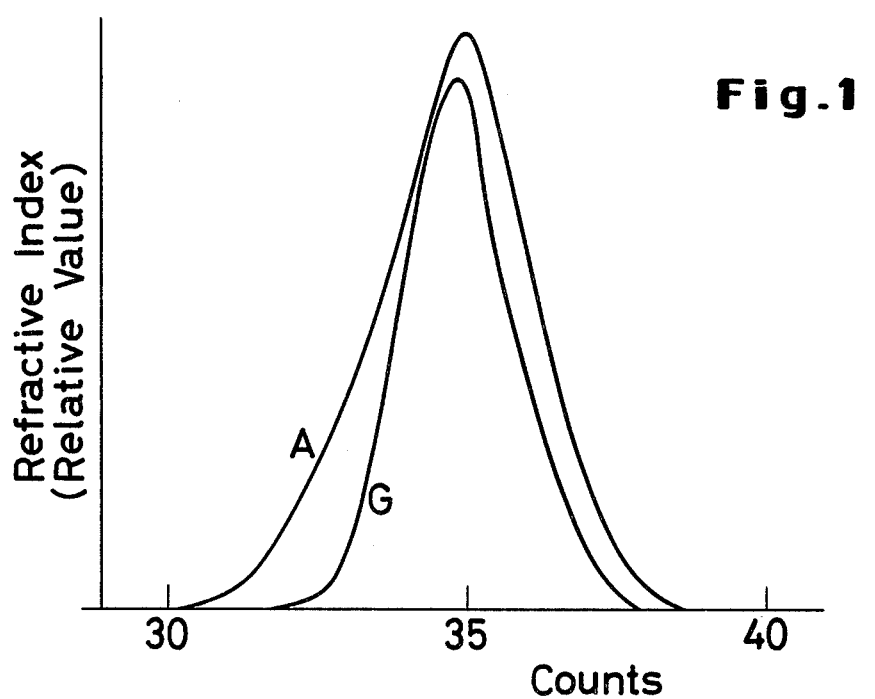

The photosensitive polyesters of the present invention are those represented by the generic formula:

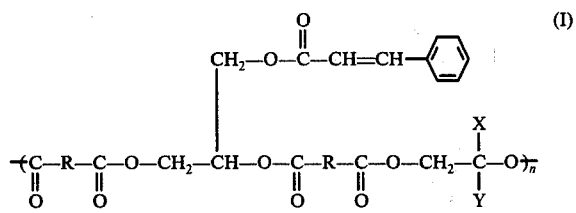

(wherein, X stands for a hydrogen atom, a lower alkyl group (particularly of the type having from one to four carbon atoms), a phenyl group or a cinnamoyl-oxymethyl group, Y for a hydrogen atom or a lower alkyl group, R for $-CH=CH-$, $-CH_2-CH_2-$ or O-phenylene group and n for an integer having the value of not less than 5).

In the polyesters of the present invention, the values of $n$ in the generic formula are not less than 5. Those polyesters whose values of $n$ fall in the range of from 5 to 20 are in the form of viscous liquids at elevated temperatures. They become solid, however, when they are cooled to room temperature. The polyesters of this invention are such that, depending on the percentage composition of the components used and the conditions adopted for polymerization, they are obtained with molecular weights dispersed over a wide range. Generally for practical purposes, they are produced with molecular weights falling in the approximate range of from about 5000 to 15000. The polyesters of this invention which have molecular weights in this range are in the form of rigid brittle resinous substances.

These polyesters are soluble in tetrahydrofuran and acetone.

When a polyester of the foregoing description is dissolved in tetrahydrofuran or acetone and a film is formed from the resultant solution, the film upon exposure to light is readily photo-cross-linked in a short period of time even in the absence of a sensitizer, to afford consequently a film which is no longer soluble in solvents and is excellent in adhesiveness with metallic sheets such as zinc sheet, for example. This means that the film is suitable as a photosensitive material for use in manufacture of printing plates desired to be possessed of surface rigidity.

In the infrared absorption spectrum obtained of the polyester produced by the reaction of glycidyl cinnamate and maleic anhydride, absorption of infrared ray due to the trans double-bond is recognized at 1640 cm$^{-1}$ and 980 cm$^{-1}$ and that due to the ester group in the range of from 1140 to 1250 cm$^{-1}$. The absorption at 1640 cm$^{-1}$ and 980 cm$^{-1}$ gradually dwindles in intensity as the exposure to light increases in duration. In the infrared absorption spectrum of the polyester produced by the reaction of glycidyl cinnamate and phthalic anhydride, absorption due to the double bond is recognized at 1640 cm$^{-1}$ and 980 cm$^{-1}$ and that due to the ortho-substituted benzene at 740 cm$^{-1}$. The absorption due to the double bond decreases in intensity in proportion as the duration of the exposure to light increases. After these polyesters have undergone the photo-cross-linking reaction, their surfaces have pencil hardness in the range of from 4H to 5H. The polyesters of the present invention, when dissolved in tetrahydrofuran or acetone, shaped in thin layers, dried and exposed to light, yield films of high surface hardness similar to those made of unsaturated polyester resins and alkyd resins. Thus, they are useful as cold photocuring type paints for metal surfaces and glass, surface coating agents and adhesives and are particularly useful in cases where the material to be coated or bonded cannot withstand heating. Non-solvent type liquid composites prepared by mixing these polyesters such as with styrene monomer can be induced to undergo thorough curing such as by exposure to ultraviolet rays. The polyesters, therefore, are useful as curing accelerators.

Now the method by which the polyesters of the present invention are manufactured will be described. The manufacture can be accomplished by causing glycidyl cinnamate to be reacted upon by compounds of the generic formula:

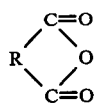

(II)

(wherein, R is —CH=CH—, —CH$_2$—CH$_2$— or O-phenylene group) under heating in the presence of a basic catalyst.

To be specific, the compounds represented by the formula (II) above are phthalic anhydride, maleic anhydride and succinic anhydride.

Such an acid anhydride, for the purpose of said reaction, is desired to be in an amount such that the molar ratio thereof to glycidyl cinnamate will fall in the range of from 0.1 to 1.5. Where the polyester is required to have the maleate group as the terminal group, it is advantageous for the amount of the corresponding acid anhydride participating in the polymerization reaction to be increased. Particularly advantageous results are obtained in the reaction by using the reactants in amounts giving the molar ratio of 1.

Though the reaction is desirably carried out without using any solvent, it may be effected in an inactive organic solvent. Examples of organic solvents usable advantageously for this reaction include toluene, xylene and dimethylformamide.

Examples of catalysts which are desirably used in the reaction are basic catalysts such as tertiary amines and their salts. Specifically they include trimethylamine, tetramethyl-ammonium chloride, tetramethyl-ammonium bromide, triethylamine, tetraethyl-ammonium chloride and tetraethylammonium bromide. Desirably, such a catalyst is used in an amount of not more than 0.2 percent by weight based on the reactants. If the amount of the catalyst is greater than this level, then there is a possibility that the reaction system will induce the phenomenon of gelation during the polymerization under heating.

The reaction involved in the method of this invention is effected by heating the reactants generally to temperatures of from 100° to 150° C. This heating of the reactants must be stopped at the time that the gradually increasing viscosity of the polymerization product reaches the point at which it loses almost all its fluidity. If the heating is further continued, there is entailed the phenomenon of gelation.

As is quite usual in the art, the product of the reaction of this invention can, if desired, be given a low degree of polymerization by properly shortening the duration of said heating. For the purpose of modification in the finally produced polyester, part of the glycidyl cinnamate to be used in the reaction may be substituted with some other epoxide compound.

The present invention will be described in further detail with reference to working examples hereinbelow.

EXAMPLE 1

Maleic anhydride, glycidyl cinnamate and tetramethylammonium chloride in respective amounts of 10.2 g, 20.4 g and 0.02 g were mixed. The mixture was pre-heated so as to dissolve the crystals of maleic anhydride and thereafter heated in an oven at 105° C for 3 hours, with the result that the oven contents became viscous and the decreasingly fluid and finally solid. Consequently, there was obtained a rigid and brittle resinous substance of light brown color.

In the infrared absorption spectrum obtained of this substance, absorption due to the trans double bond were recognized at 1640 cm$^{-1}$ and 980 cm$^{-1}$ and that due to the ester group at 1140 to 1250 cm$^{-1}$. Thus, the substance was identified to be a polyester having the following formula and consequently conforming to the present invention.

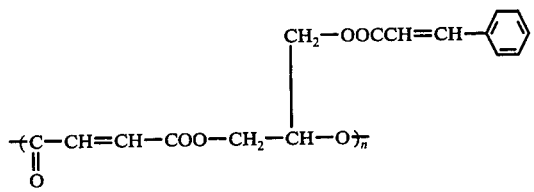

This substance is found to have an average molecular weight of about 6000 in accordance with the gelpermeation chromatograph of FIG. 1(A) obtained by using a standard polystyrene as the reference substance. In the data of FIG. 1, those indicated by A have bearing upon the results of Example 1. In the graph, 1-A, the vertical axis is graduated for average molecular weight ($\overline{M}_n$) and the horizontal axis for counts. In the graph 1-B, the vertical axis is graduated for reflactive index and the horizontal axis for counts.

Figure 2:
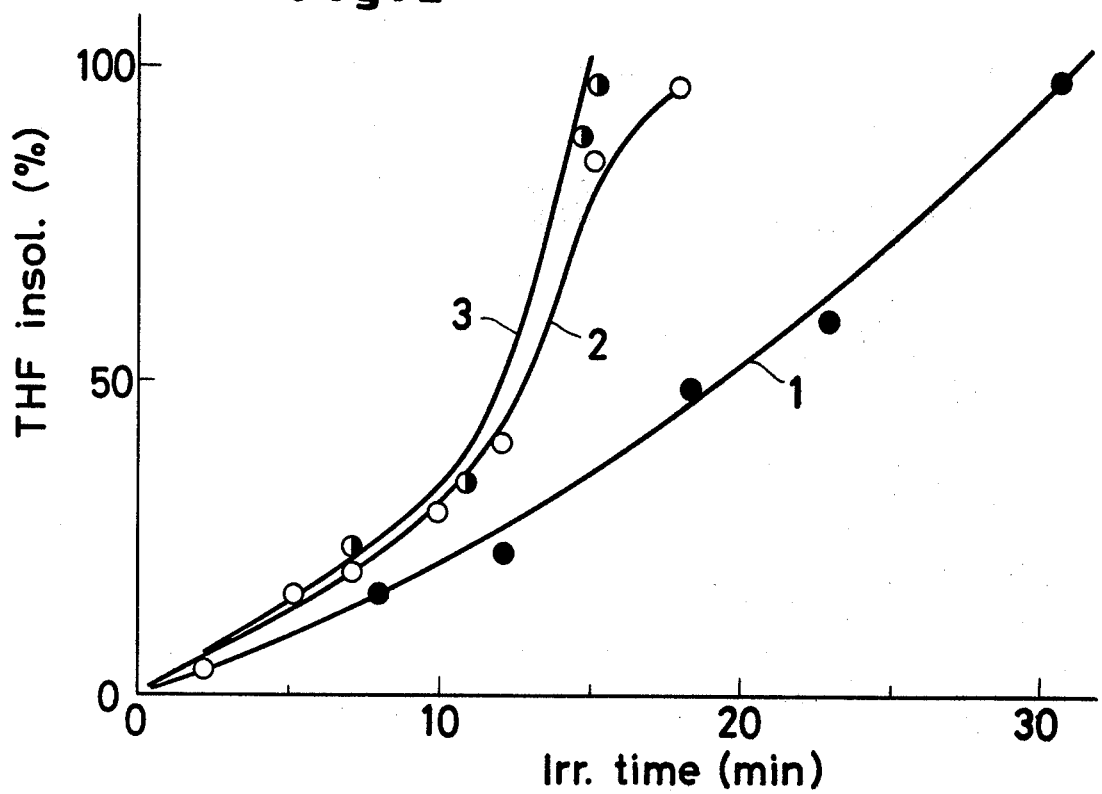
FIG. 2 is a graph showing the photosensitive behavior of the polyester formed in Example 1.

This substance was soluble in tetrahydrofuran and acetone. A tetrahydrofuran solution of this substance (2%) was cast on sheets of glass and evaporated under vacuum to produce resinous layers of varying thicknesses of from 2 to 7 mg/1.5 cm$^2$. When these layers were irradiated by a 250-W high-pressure mercury vapor lamp kept at a distance of 30 cm, they were substantially completely photo-crosslinked in 15 minutes. The films thus formed were found to be no longer soluble in tetrahydrofuran. The photosensitive behavior of the films is shown in FIG. 2. In the graph, the data indicated by solid circles (●) are of the film 6–7 mg/1.5 cm² of thickness, those indicated by blank circles (o) are of the film 3–4 mg/1.5 cm² of thickness and those indicated by semisolid circles (◖) are of the film 2–3 mg/cm² of thickness respectively. The numerals 1, 2 and 3 represent curves drawn through these dots in the graph. It is seen from the graph that the rate of photosensitization lowers and the duration of the exposure to light until complete curing increases in proportion as the weight of resin per unit area of the resin film increases. In the graph, the vertical axis is graduated for insolubility in tetrahydrofuran and the horizontal axis for the duration of exposure time (in minutes).

The photo-crosslinking of this polyester is believed to be ascribable to the dimerization of cinnamoyl groups. This polyester was found to cure more readily than the polyester produced by the reaction of glycidyl cinnamate with phthalic anhydride illustrated in Example 2. It is consequently inferred that the photo-crosslinking is accelerated because there occurs a reaction as shown by the following formula (III).

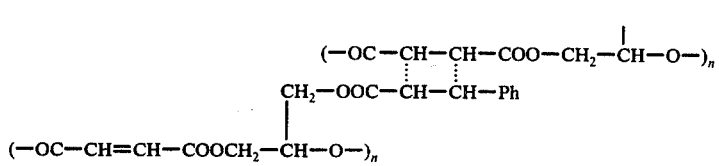

(III)

The resin layers formed by the method of this invention were found to have surface hardness of 5H as measured in the pencil hardness.

EXAMPLE 2

Phthalic anhydride, glycidyl cinnamate and tetramethylammonium chloride in respective amounts of 15.6 g, 23.0 g and 0.08 g were mixed. The mixture was preheated so as to have the crystals of phthalic anhydride dissolved and subsequently heated at 105° C for 1.5 hours in an oven. The mixture became gradually viscous and eventually solid. Thus, there was obtained a colorless, clear, rigid and brittle resinous substance.

In the infrared absorption spectrum obtained of this substance, absorption due to the C=C—Ph group was recognized at 770 cm⁻¹, that due to the trans double bond at 980 cm⁻¹, that due to the C=C bond at 1640 cm⁻¹ and that due to the ester group at 1140–1250 cm⁻¹ respectively. Thus, the substance was identified to be a polyester having the following formula and therefore conforming to the present invention.

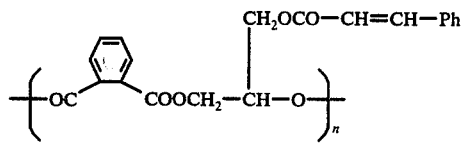

The substance is found to have a molecular weight of about 6000 in accordance with the gelpermeation chromatograph as shown by "G" of FIG. 1.

A tetrahydrofuran solution of this substance was cast on sheets of glass to produce resin layers of varying thicknesses of 4 to 6 mg/1.5 cm². These resin layers were irradiated by the light from a 250-W high-pressure mercury vapor lamp placed at a distance of 30 cm for about 20 minutes. Consequently, there were obtained photo-crosslinked films having 70% of insolubility in tetrahydrofuran.

Figure 3:
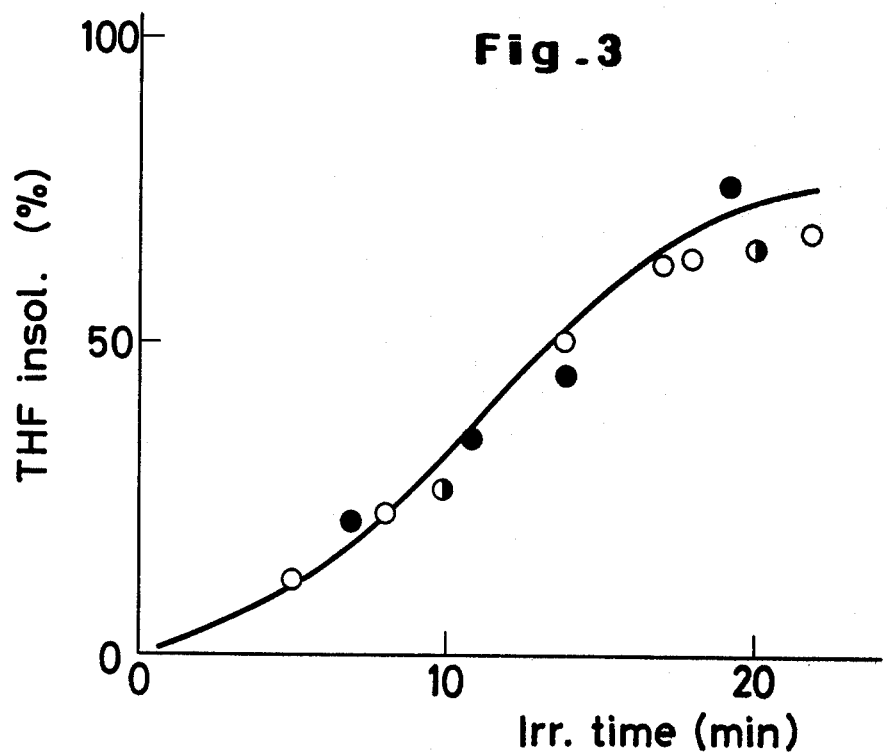
FIG. 3 is a graph showing the photosensitive behavior of the polyester formed in Example 2.

The photosensitivity of the films is illustrated in FIG. 3. In the graph, the vertical axis is graduated for insolubility in tetrahydrofuran and the horizontal axis for duration of exposure to light (in minutes). In the graph, the data indicated by solid circles and blank circles (● and o) are of films 4–5 mg/1.5 cm² of thickness and those indicated by semi-solid circles (◖) are of films of 5–6 mg/1.5 cm².

It is evident from the graph that the rate of curing velocity decreases before perfect insolubility (namely, completion of curing). After the insolubilization, the resin layers formed transparent films having 4H of pencil hardness.

What is claimed is:

1. A photosensitive polyester composed of at least five repeating units each of the formula:

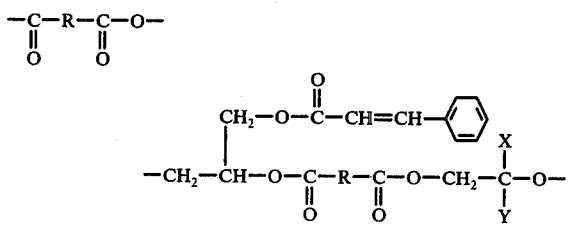

wherein, X is selected from the group consisting of a hydrogen atom, alkyl groups having one to four carbon atoms, a phenyl group and a cinnamoyl-oxymethyl group, Y is selected from the group consisting of a hydrogen atom and alkyl groups having one to four carbon atoms and R is —CH=CH—.

2. The photosensitive polyester according to claim 1, wherein X is a cinnamoyl-oxymethyl group and Y is a hydrogen atom.

3. A method for the manufacture of a photosensitive polyester composed of at least five repeating units each having the formula:

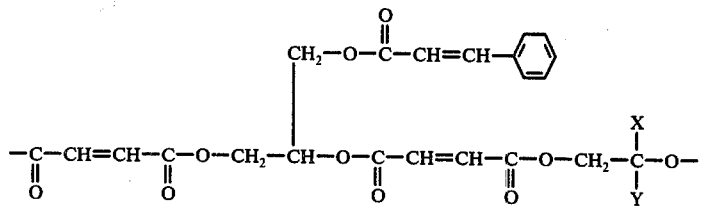

Wherein, X is selected from the group consisting of a hydrogen atom, alkyl groups having one to four carbon atoms, a phenyl group and a cinnamoyloxymethyl group and Y is selected from the group consisting of a hydrogen atom and alkyl groups having one to four carbon atoms, which method comprises reacting glycidyl cinnamate with maleic anhydride, with heating, in the presence of at least one basic catalyst selected from the group consisting of trimethylamine, tetramethylammonium chloride, tetramethylammonium bromide, triethylamine, tetraethylammonium chloride and tetraethylammonium bromide.

4. The method of claim 3, wherein the molar ratio of said anhydride to said glycidyl cinnamate falls in the range of from 0.5 to 1.5; said basic catalyst is used in an amount of not more than 0.2 percent by weight based on the reactants; and the heating is carried out at temperatures in the range of from 100° to 150° C.

* * * * *